United States Patent  
Cerva et al.

(10) Patent No.: US 6,790,676 B2  
(45) Date of Patent: Sep. 14, 2004

(54) METHOD FOR PRODUCING A FERROELECTRIC LAYER

(75) Inventors: Hans Cerva, Munich-Untersendling (DE); Walter Hartner, Glenn Allen, VA (US); Frank Hintermaier, Munich (DE); Joachim Hoepfner, Planegg (DE); Guenther Schindler, Munich (DE); Volker Weinrich, Paris (FR); Franz Winterauer, Bad Ischl. (AU)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 10/204,830

(22) PCT Filed: Feb. 22, 2001

(86) PCT No.: PCT/EP01/02035

§ 371 (c)(1),
(2), (4) Date: Dec. 5, 2002

(87) PCT Pub. No.: WO01/63658

PCT Pub. Date: Aug. 30, 2001

(65) Prior Publication Data

US 2003/0138977 A1 Jul. 24, 2003

(30) Foreign Application Priority Data

Feb. 24, 2000 (DE) .......................................... 100 08 617

(51) Int. Cl.[7] .............................................. H01L 21/00
(52) U.S. Cl. .............................. 438/3; 438/660; 257/295
(58) Field of Search ................................ 438/795–799, 438/660, 3; 257/295

(56) References Cited

U.S. PATENT DOCUMENTS

| | | | |
|---|---|---|---|
| 5,193,023 A | * | 3/1993 | Yamada et al. ............. 359/245 |
| 5,440,157 A | | 8/1995 | Imai et al. |
| 5,618,761 A | | 4/1997 | Eguchi et al. |
| 5,911,832 A | | 6/1999 | Denholm et al. |
| 5,936,832 A | * | 8/1999 | Saito et al. ............. 361/321.4 |
| 6,096,592 A | | 8/2000 | Cho |
| 6,194,751 B1 | * | 2/2001 | Evans, Jr. .................... 257/295 |
| 6,198,119 B1 | * | 3/2001 | Nabatame et al. .......... 257/295 |
| 6,322,849 B2 | * | 11/2001 | Joshi et al. .................... 427/96 |

FOREIGN PATENT DOCUMENTS

| | | |
|---|---|---|
| EP | 0 669 655 | 8/1995 |
| EP | 0 860 868 | 8/1998 |
| EP | 0 975 516 | 11/1999 |
| JP | 09232532 | 9/1997 |
| JP | 2000-31151 | 1/2000 |

OTHER PUBLICATIONS

Abstract of Japanese Published Application 10233489, published Sep. 9, 1998, *Patent Abstracts of Japan*, Dec. 31, 1998.

Moazzami, "Ferroelectric thin film technology for semiconductor memory", *Semiconductor Science and Technology*, Apr. 10, 1995, No. 4, Bristol, GB, pp. 375–390.

Furuya et al, "Electrical Characteristics of $SrBi_2Ta_2O_9$ Capacitor after Aluminum Metallization", *Japanese Journal of Applied Physics*, vol. 37, Part 1, No. 7, pp. 4037–4040.

* cited by examiner

Primary Examiner—Matthew Smith
Assistant Examiner—Calvin Lee
(74) Attorney, Agent, or Firm—Schiff Hardin LLP

(57) ABSTRACT

A method for producing a ferroelectric layer includes preparing a substrate, applying a layer of material, which will be subsequently converted into the ferroelectric layer, and changing the material into the ferroelectric layer by applying an outer electrical field aligned with the direction desired in the ferroelectric material and heat treating the material. By providing a first noble metal electrode on the surface before applying the material that is to become the ferroelectric layer and then subsequently forming a second noble metal electrode on the ferroelectric layer, a ferroelectric storage capacitor can be formed. If the substrate is provided with memory cells, which include at least one transistor for each cell and the above-mentioned ferroelectric storage capacitors, a ferroelectric memory arrangement can be produced.

17 Claims, 5 Drawing Sheets

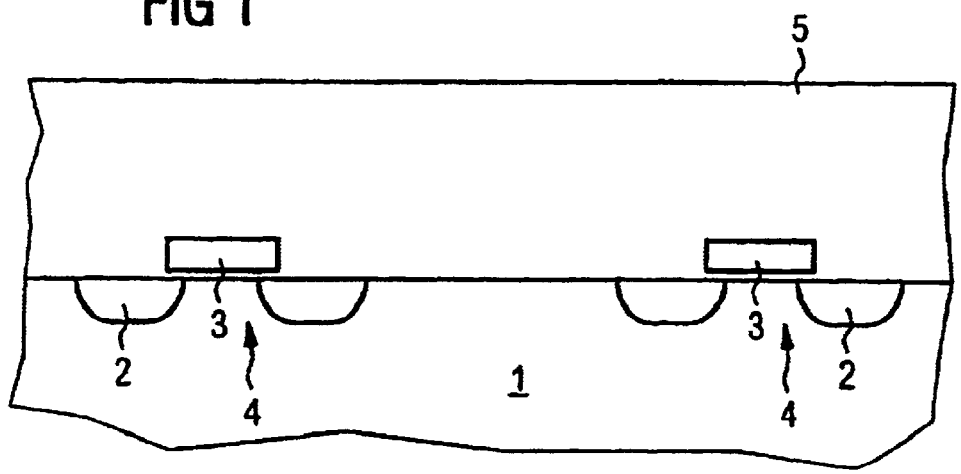
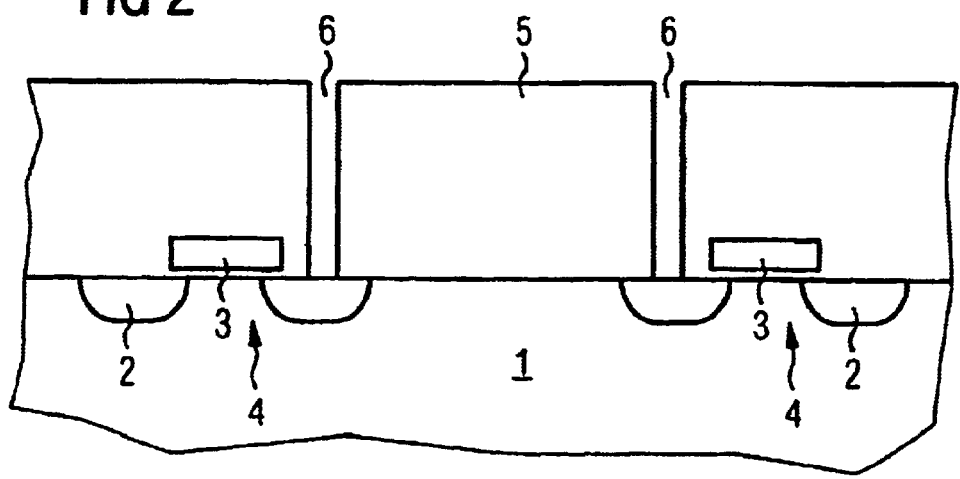

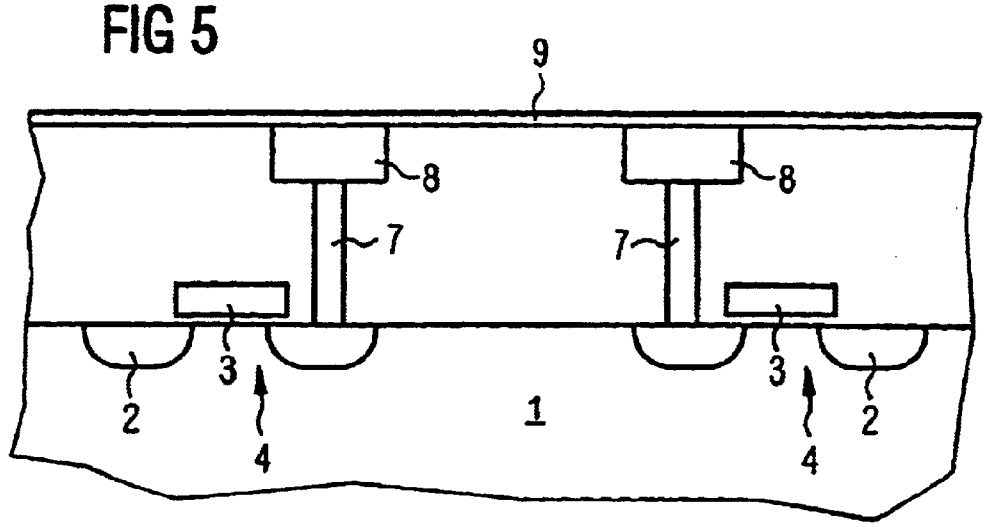
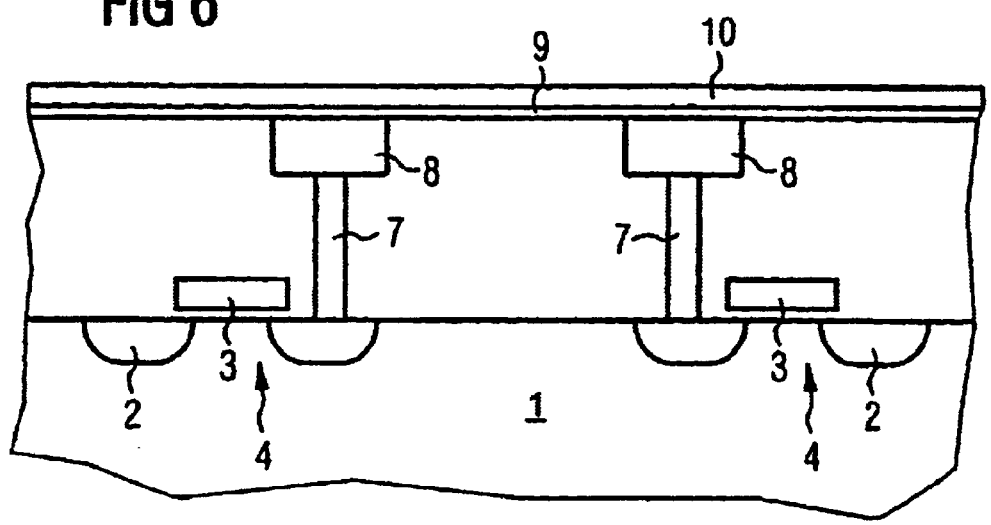

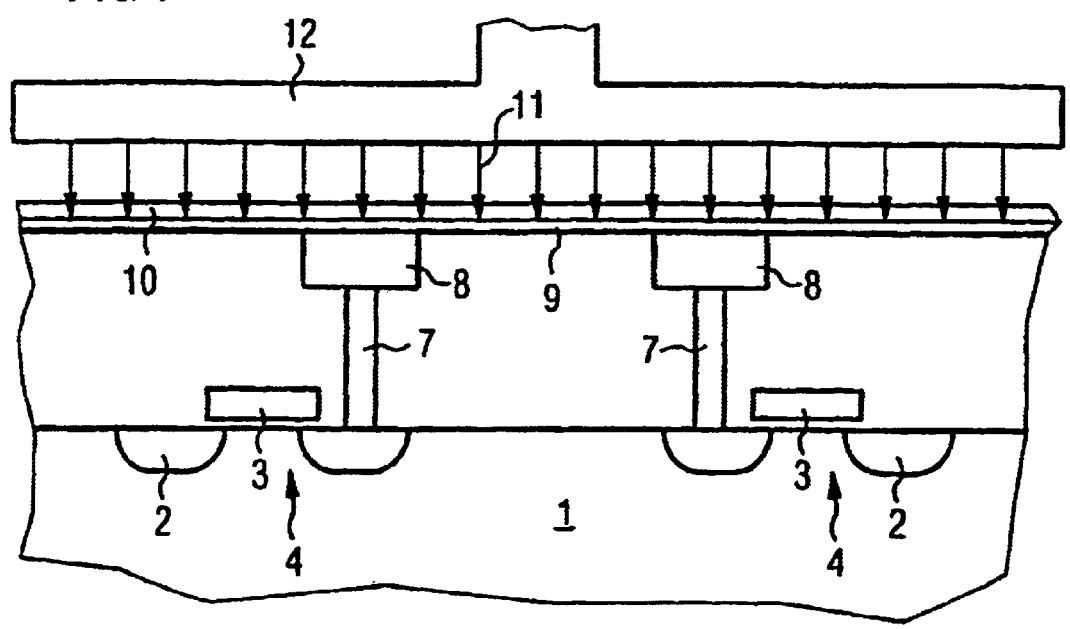
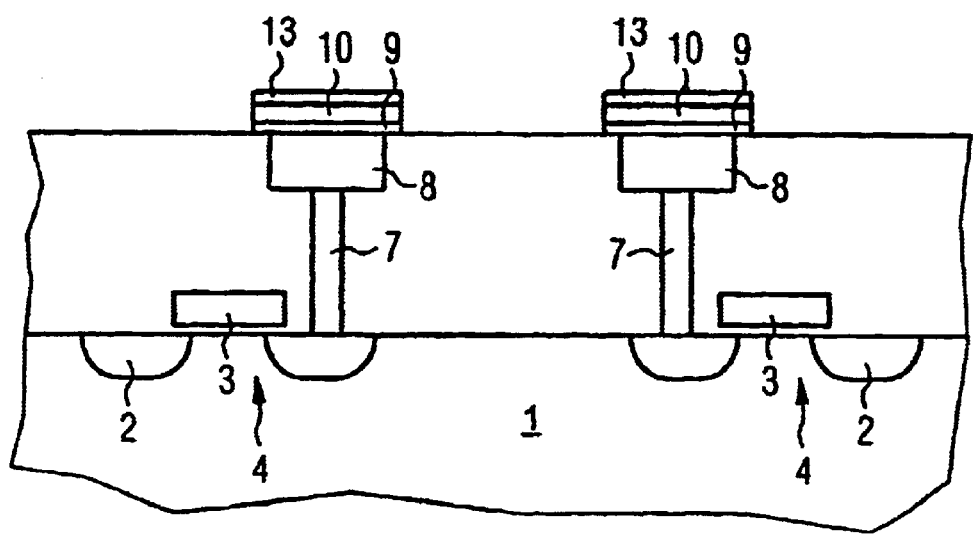

METHOD FOR PRODUCING A FERROELECTRIC LAYER

BACKGROUND OF THE INVENTION

The present invention relates to a method for producing a ferroelectric layer. The present invention relates in particular to a method for producing a ferroelectric layer for an integrated memory arrangement, and to a method for producing a storage capacitor.

An advantage of ferroelectric memory arrangements over conventional memory arrangements, such as DRAMs and SRAMs, is that the stored information is not lost, but remains stored, even in the event of an interruption in the voltage or current supply. For this purpose, storage capacitors are generally used for storing information, even in ferroelectric memory arrangements. In order to produce storage capacitors such as these, a ferroelectric material, for example $SrBi_2Ta_2O_9$ (SBT) or $Pb(Zr, Ti)O_3$ (PZT), is inserted between the electrodes of the capacitor. The non-volatility of ferroelectric memory arrangements is based on the fact that, in the case of ferroelectric materials, the polarization which is applied by an external electric field is essentially retained even after the external electric field is switched off. In this case, the signal which can be read from the storage capacitors is higher when the level of polarization that can be applied to the ferroelectric material is higher. This means that, in order to make it possible to ensure a sufficiently high signal for reading from a storage capacitor, a high remanent polarization is required between the electrodes of the capacitor.

Ferroelectric materials are characterized in that they have microstructural domains which have an electrical polarization. The alignment of this polarization is linked to the orientation of the respective crystal lattice. Thus, for example in the case of PZT, the polarization is aligned in the direction of the crystallographic [001] axis. In the case of SBT, the vector of the electrical polarization is mainly parallel to the a axis ([100] orientation) or parallel to the b axis ([010] orientation). However, both axes are virtually equivalent, since this is a pseudotetragon lattice.

Since the crystals of ferroelectric materials are generally randomly oriented, the domains and hence the vectors of the electrical polarization are also oriented randomly. If an external electric field is now applied, then the polarization vectors of the individual domains are aligned such that they are as parallel as possible to the applied external field. For domains whose crystal is aligned such that the [100] axis is at right angles to the plates of the capacitor, this means that the entire polarization vector of the domains runs parallel to the external field. For differently oriented domains, only that component of the polarization vector which is parallel to the external field is relevant. The macroscopically measurable overall polarization, which is at right angles to the electrodes of the capacitor, is the sum of the individual polarizations of the domains. This sum becomes higher the more preferably the individual domains are aligned at right angles to the electrodes of the capacitor, that is to say for example in the case of SBT, the greater is the proportion of the crystal whose [100] axis is at right angles to the electrodes of the capacitor.

A high remanent polarization is of critical importance for the use of ferroelectric thin films in large scale integrated components, for example in integrated memory arrangements with structure sizes of less than 0.25 $\mu$m since, in this case, not only is the surface area of the capacitor very small, but these structures also have a very large surface area in comparison to their volume. The surface area of ferroelectric materials is, however, always subject to damage, resulting from the structuring, and this leads to a reduction in the remanent polarization. In addition to the actual structuring of the ferroelectric materials, further processes, which are essential for the production of integrated components (for example forming gas heat treatment, TEOS oxide/$SiO_2$ deposition etc) also lead to a degradation of the ferroelectric material and, in a corresponding manner, to a reduction in the remanent polarization. As a result of this process-dependent reduction in the polarization, it is important to have a material whose polarization is as high as possible before the start of the structuring and the subsequent processes.

Accordingly, it is preferable to monitor the orientation of the ferroelectric material, that is to say for example in the case of SBT to produce as much [100] or [010] oriented material as possible, or in the case of PZT to produce as much [001] oriented material as possible, whose polarization vectors are at right angles to the electrodes of the storage capacitor. In the case of SBT, other orientations are also useful within the a, b plane (for example [110]). Although these have less polarization, the polarization is, however, still considerably greater than if there were a large number of domains aligned along the c axis. If, in a corresponding manner, it were possible to give ferroelectric materials a preferred orientation, this would result in a very high remanent polarization.

SUMMARY OF THE INVENTION

The object of the present invention is to specify a method for producing a ferroelectric layer, which is able to align the majority of the domains of the layer along a predetermined direction, and to specify a method for producing storage capacitors which have a high remanent polarization.

According to the invention, this object is achieved by a method for producing a ferroelectric layer and by a method for producing a ferroelectric storage capacitor. Furthermore, a ferroelectric layer which is produced in this way and a memory arrangement which is produced in this way are provided. Further advantageous embodiments, characteristics and aspects of the present invention can be found in the claims, in the description and in the attached drawings.

According to the invention, a method is provided for producing a ferroelectric layer, which method has the following steps:

a) a substrate is provided, b) the material for the subsequent ferroelectric layer is applied to the substrate, c) heat treatment is carried out in the presence of an electric field which is aligned along a predetermined direction, so that the material is changed to a ferroelectric phase.

The method according to the invention has the advantage that the application of an external electric field simplifies the crystallization of the material on the basis of the predetermined direction. Without wishing to impose any restriction, the inventors are of the opinion that this can be explained by the fact that the crystallization will always run in the direction which results in a state with the least Gibb's free energy. Normally, this will be a material with randomly oriented crystals, since this allows a state with very high entropy to be produced. However, if an external electric field is applied, then an additional energy term is added, which describes the interaction between the external field and the ferroelectric polarization. This energy term is generally a minimum when the polarization of the resultant ferroelectric material runs parallel to the external field. This also means that the stronger the external field, the more strongly the material is aligned in the predetermined direction. A ferroelectric material can accordingly be produced in which the crystallization, for example in the case of SBT, is aligned in a preferred manner in the [100], [010] or [110] direction or, in the case of PZT in the [001] direction.

Suitable choice of the alignment of the field which is applied for crystallization allows ferroelectric layers to be produced whose domains are aligned in a preferred manner such that their polarization vectors are at right angles to the electrodes of the storage capacitor in a memory cell. This means that, during operation of the memory arrangement, the entire polarization vector of the domains runs essentially parallel to the field of the storage capacitor, and a correspondingly high remanent polarization is produced.

According to one preferred embodiment, the ferroelectric layer is a strontium bismuth titanate layer (SBT, $SrBi_2Ta_2O_9$) and heat treatment is carried out at a temperature range of between 500° and 820° C., preferably at a range of between 700° and 800° C. It is particularly preferable for the heat treatment to be carried out at a temperature range of between 700° and 750° C. According to a further preferred embodiment, the ferroelectric layer is a lead zirconate titanate layer (PZT, $Pb(Zr, Ti)O_3$), and the heat treatment is carried out at a temperature range of between 400° and 600° C. The heat treatment is preferably carried out over a time period of 5 to 90 minutes, preferably a period of 10 to 30 minutes.

It is furthermore preferable for the field strength of the electric field to be in a range between 1 and 100 kV/cm, preferably a range between 20 and 40 kV/cm.

According to one preferred embodiment, the substrate is used as an electrode for application of the electric field. In this case, it is particularly preferable for a noble metal electrode, in particular a platinum electrode, to be provided on the surface of the substrate. According to one preferred embodiment, a conductive plate is used as the second electrode, and is arranged above the material of the subsequent ferroelectric layer. According to a further preferred embodiment, a plasma is used as the second electrode, and is produced above the material of the subsequent ferroelectric layer. The use of a plasma above the subsequent ferroelectric layer has the advantage that the plasma extends directly as far as the material, so that the applied electric field can be applied directly to the material. In this case, it is preferable for the plasma to be produced either by an alternating frequency or voltage pulses. In this case, it is particularly preferable for the substrate to be immersed in the plasma by means of voltage pulses. When an additional conductive plate is used, a gap is generally provided between the plate and the material, in which there is likewise an electric field, which means that a higher voltage needs to be applied in order to form the electric field.

According to one preferred embodiment, the heat treatment is carried out either in an $N_2/O_2$ atmosphere or in an $He/O_2$ atmosphere. It is furthermore preferable for the heat treatment to be carried out at a pressure range of between 0.05 and 10 Pa.

According to a further preferred embodiment, the material of the ferroelectric layer is applied to the substrate by means of a CVD method. In this case, it is particularly preferable for the material of the subsequent ferroelectric layer to be applied to the substrate as an essentially amorphous film.

The invention will be explained in more detail in the following text with reference to the drawings.

BRIEF DESCRIPTION OF THE DRAWINGS

FIGS. 1–8 show method steps for producing a ferroelectric layer based on a first exemplary embodiment of the invention, in the course of producing a ferroelectric memory cell;

DESCRIPTION OF THE PREFERRED EMBODIMENTS

Figure 3:
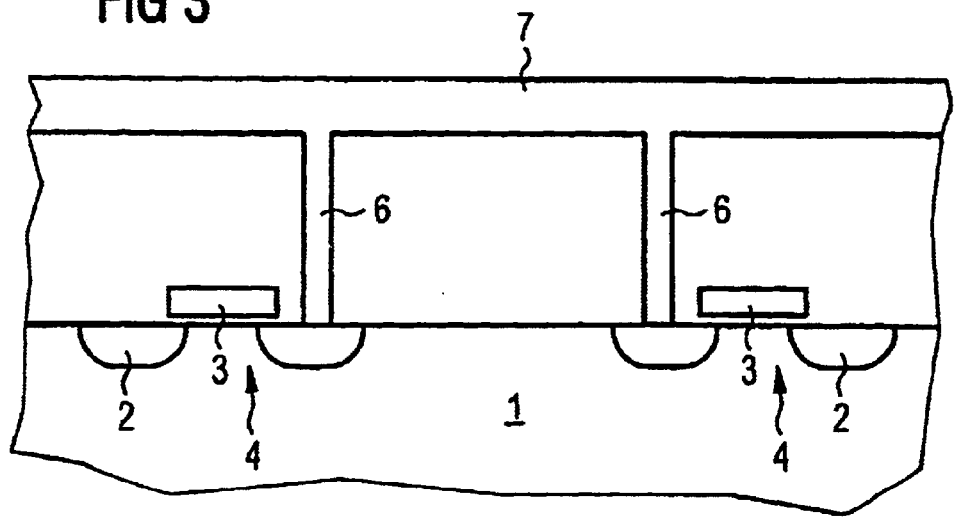

FIG. 1 shows a silicon substrate 1 with transistors 4 that have already been completed. Together with the storage capacitors that are still to be produced, the transistors form the memory cells, which are used for storing the binary information. The transistors 4 each have two diffusion regions 2, which are arranged on the surface of the silicon substrate 1. The channel zones are arranged between the diffusion regions 2 of the transistors 4, and are separated by the gate oxide from the gate electrodes 3 on the surface of the silicon substrate 1. The transistors 4 are produced using the methods which are known from the prior art, and which will not be explained in any more detail here.

An insulating layer 5, for example an $SiO_2$ layer, is applied to the silicon substrate 1 with the transistors 4. A number of insulating layers may also be applied, depending on the method which is used for producing the transistors 4. FIG. 1 shows the structure which results from this.

The contact holes 6 are then produced by means of a photographic technique. These contact holes 6 produce a connection between the transistors 4 and the storage capacitors, which are still to be produced. The contact holes 6 are produced, by way of example, by anisotropic etching using gases containing fluorine. The structure which results from this is shown in FIG. 2.

A conductive material 7, for example in-situ doped polysilicon, is then applied to the structure. This may be done, for example, by means of a CVD method. The application of the conductive material 7 results in the contact holes 6 being completely filled, resulting in a cohesive conductive layer on the insulating layer 5 (FIG. 3). This is followed by a CMP (chemical mechanical polishing) step, which removes the cohesive conductive layer on the surface of the insulating layer 5, and produces a flat surface.

Depressions, which overlap the contact holes 6, are then formed in the insulating layer 5. These depressions are now filled with a barrier material 8, for example iridium oxide. This is done by depositing the barrier material 8 over the entire surface, after which a further CMP step is then carried out. Suitable CMP methods are known. The structure which results from this is shown in FIG. 4.

Figure 4:
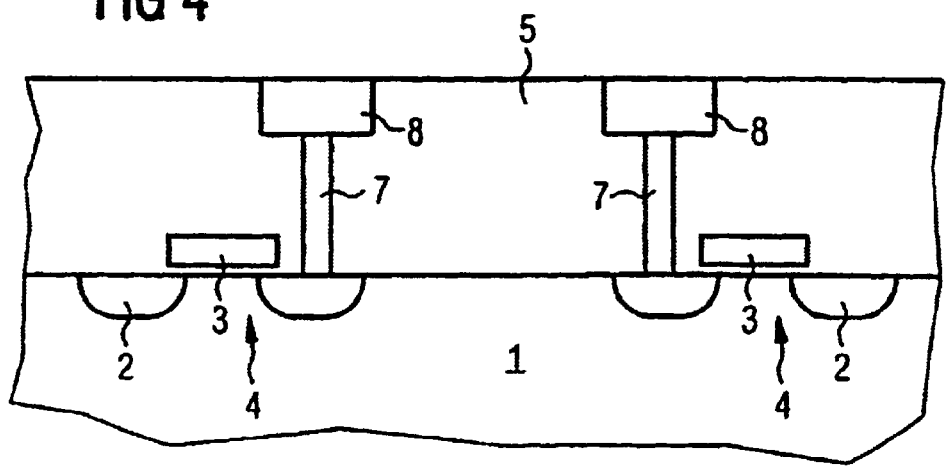

The lower electrode of the storage capacitors is then deposited over the entire surface on the structure which is shown in FIG. 4. Owing to their good oxidation resistance and/or the formation of electrically conductive oxides, 4d and 5d transitional metals, in particular platinum metals (Ru, Rh, Pd, Os, Ir, Pt) and, in particular platinum itself, may be used as the electrode material. The noble metal layer 9, for example platinum, is applied by a sputtering method, at a sputtering temperature of about 550° C. The thickness of the noble metal layer 9 is in this case approximately 100 nm. The structure which results from this is shown in FIG. 5.

This completes the group of steps for providing a substrate, or the first step a), of the method according to the invention. A substrate, to which the material of the ferroelectric layer can now be applied in a subsequent step, has now been produced.

This is followed by the production of a ferroelectric layer. An SBT film 10 is deposited onto the substrate prepared in this way, using a CVD process. The CVD process is carried out at a substrate temperature of 385° C., and at a chamber pressure of about 1200 Pa. The proportion of oxygen in the gas mixture is 60%. In this case, the SBT film 10 is deposited on the metal layer 9 as an amorphous film, which essentially does not allow any crystal structures to be seen when investigated using X-ray or electron beams. In a corresponding way, the SBT film 10 essentially does not have any ferroelectric characteristics yet. The structure which results from this is shown in FIG. 6.

The deposited, amorphous SBT 10 is then heat treated for 10 to 30 minutes at a temperature range of between 700° and 750° C. During the heat treatment process, an external electric field 11 is applied. The order of magnitude of the externally applied field 11 should in this case preferably correspond to the coercivity field strength of the subsequent ferroelectric layer, that is to say, for example, 30 kV/cm for SBT. In this embodiment of the present invention, an additional conductive plate 12 is arranged directly above the SBT film 10 in order to produce the external electric field 11. The distance between the conductive plate 12 and the SBT film 10 is in this case about 1 mm. The application of a voltage between the conductive plate 12 and the platinum layer 9 now results in an electric field being produced which is aligned at right angles to the platinum layer 9 and to the plate 12. The voltage which is applied between the conductive plate 12 and the platinum layer 9 is in this case about 30 kV. In order to avoid a voltage flashover, the pressure of the $N_2O_2$ atmosphere which is used for heat treatment in this exemplary embodiment is reduced to about 0.1 to 10 Pa. If an $He/O_2$ atmosphere is used instead of an $N_2/O_2$ atmosphere, it is possible to work at a considerably higher pressure. Depending on the application, the heat treatment may also be carried out in a pure helium atmosphere.

The presence of the electric field 11 results in the domains which are formed in the SBT layer 10 preferably being aligned in the predetermined direction of the electric field 11. A ferroelectric SBT layer can accordingly be produced in which the domains are aligned in a preferred manner in the [100], [010] or [110] direction. The domains are in this case aligned such that their polarization vectors are at right angles from the electrodes of the storage capacitor, which is still to be produced, and this accordingly results in a high remanent polarization. The structure which results from this is shown in FIG. 7.

The upper electrode of the storage capacitors is then deposited over the entire surface on the structure shown in FIG. 7. Once again, owing to their good oxidation resistance and/or the formation of electrically conductive oxides, 4d and 5d transitional metals, in particular platinum metals (Ru, Rh, Pd, Os, Ir, Pt), and in particular platinum itself, are used as the electrode material. The noble metal layer 13, for example platinum, is likewise applied by means of a sputtering method at a sputtering temperature of about 550° C. Once the upper electrode has been applied, a heat treatment process is carried out once again, in order to cure the boundary layer between the ferroelectric layer 10 and the upper electrode 13. The three layers, the noble metal layer 13, the ferroelectric layer 10 and the noble metal layer 9 are then structured using anisotropic etching methods, thus resulting in the structure which is shown in FIG. 8. The memory cells are thus essentially complete. This is followed by further steps for isolation of the individual memory cells and for producing the wiring for the memory arrangement. The methods which are used in this case are, however, prior art, and will not be explained here.

If an additional conductive plate 12 is used for producing the external electric field, relatively high voltages must be applied between the lower electrode 9 and the conductive plate 12, in order to produce a sufficiently strong field 11 in the ferroelectric layer 10. This is due to the distance between the plate 12 and the ferroelkctric layer 10, which can never be entirely avoided in practice.

Figure 9:
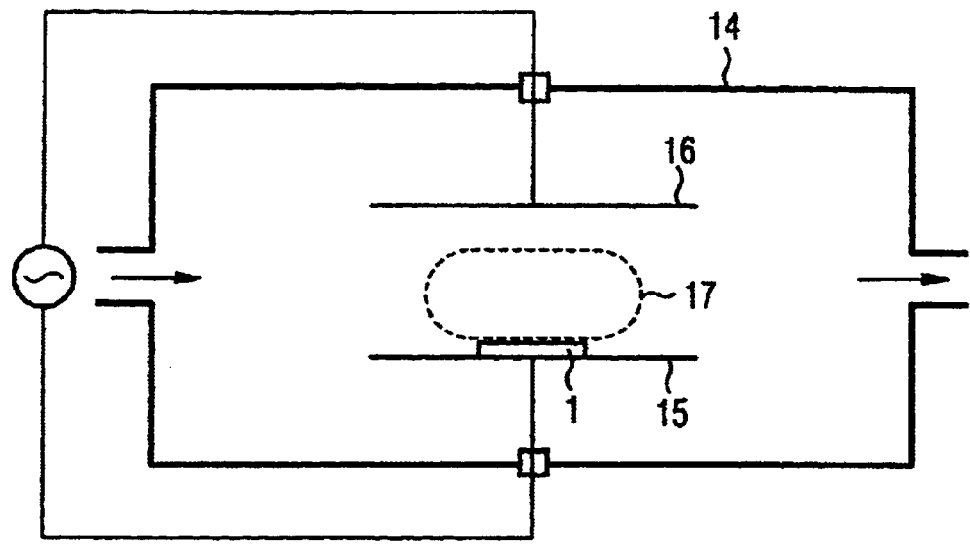
FIG. 9 shows a further method for producing a ferroelectric layer, based on a second exemplary embodiment of the invention.

In order to make it possible to reduced the voltages which are required for producing the external electric field, a plasma is provided above the layer 10, in the second embodiment of the present invention. The group of steps for providing a substrate or the first step a) of the method according to the second embodiment of the present invention in this case corresponds to that which has been explained in conjunction with FIGS. 1 to 6, so that there is no need to repeat it. The amorphous SBT layer 10 is once again heat treated at a temperature range of between 700 to 750° C. for 10 to 30 minutes. During the heat treatment, an external electric field 11 is applied. The order of magnitude of the externally applied field 11 should in this case preferably correspond to the coercivity field strength of the subsequent ferroelectric layer, that is to say for example 30 kV/cm for SBT. In this embodiment, the substrate is introduced into a parallel plate reactor 14 (see FIG. 9) in order to produce the external electric field 11.

The reactor 14 essentially consists of a vacuum chamber with an inlet for the $He/O_2$ gas mixture, and two parallel electrodes 15 and 16. The substrate 1 is positioned on the lower electrode 15. A corona discharge is produced in the $He/O_2$ gas mixture between the electrodes 15, 16, by means of a radiofrequency voltage applied to the electrodes 15, 16 resulting in a plasma 17. In contrast to the ions; the electrons, which are much lighter than the ions, can follow the radio-frequency field between the electrodes 15, 16, and can reach the electrodes 15, 16 much more quickly. The plasma 17 accordingly becomes positively charged with respect to the electrodes 15, 16 and with respect to the substrate 1, so that an electric field is produced within the SBT layer, and this is used to align the domains within the SBT layer. The electrical potential of the plasma 17 can be controlled deliberately by suitable choice of the process parameters comprising the pressure, RF power, external bias, gas flow and gas composition, so that a sufficiently strong electric field can be produced. Since the plasma 17 extends directly as far as the SBT layer, it is possible to operate with moderate potentials. Suitable parameters are, for example: cathode temperature 450° C., RF power: 1200 W, bias power: 450 W, $He/O_2$ flow: 80–150 sccm, pressure: 0.6–3.4 Pa.

After the heat treatment, the upper electrode of the storage capacitors is deposited over the entire area. Once the upper electrode has been applied, a heat treatment process is carried out, in order to cure the boundary layer between the ferroelectfic layer 10 and the upper electrode 13. The three layers, the noble metal layer 13, the ferroelectric layer 10 and the noble metal layer 9, are then structured by means of anisotropic etching methods, once again resulting in the structure which is shown in FIG. 8.

Figure 10:
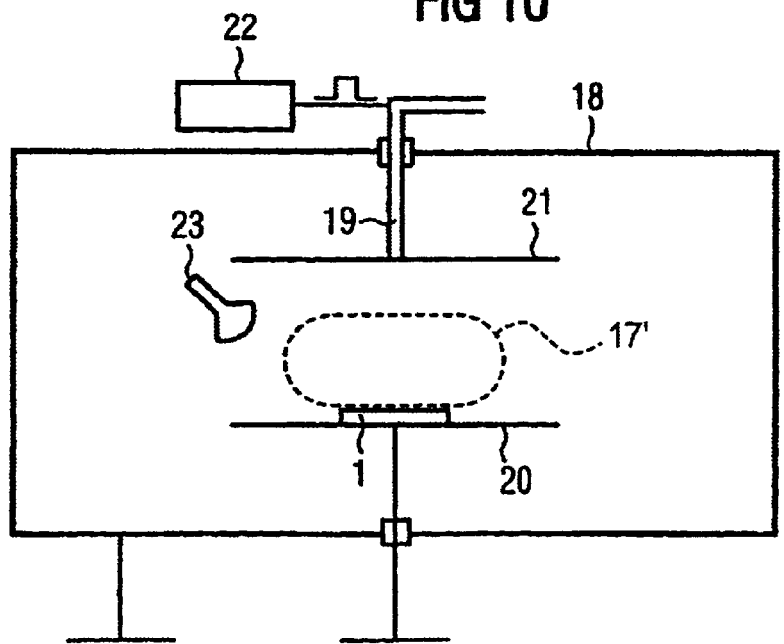
FIG. 10 shows a further method for producing a ferroelectric layer, based on a third exemplary embodiment of the invention.

In the method according to the second embodiment of the present invention, the plasma is produced by supplying RF power continuously. In the method according to a third embodiment of the present invention, the plasma is produced by means of voltage pulses. The first step a) of the method according to the third embodiment of the present invention in this case corresponds once again to the group of steps which has been explained in conjunction with FIGS. 1 to 6, so that there is no need to repeat this explanation. The amorphous SBT layer 10 is heat treated for 10 to 30 minutes at a temperature of between 700 and 750° C. During the heat treatment, an external electric field 11 is applied. In this embodiment, the substrate is introduced into a reactor 18 (see FIG. 10) in order to produce the external electric field 11.

In this case, the reactor 18 essentially consists of a vacuum chamber with an inlet 19 for the $He/O_2$ gas mixture and a mount 20 for the substrate 1. The inlet 19 has a disk 21 on its side facing the mount 20, to which pulses of a positive voltage are applied by means of a modulator 22. The walls of the vacuum chamber, the mount 20 and hence the substrate 1 are, in contrast, connected to ground. The pulses of positive voltage ionize the gas molecules and thus produce a plasma 17' in the space above the mount 20. At the same time, the positive ions within the plasma are accelerated in the direction of the substrate 1, and the plasma expands in the direction of the substrate. This results in the substrate being immersed in the plasma.

The plasma may be produced exclusively by the voltage pulses or by means of an additional plasma source, for example an ECR or microwave source (not shown). If the plasma is produced by means of an additional plasma source, the voltage pulses are mainly used to immerse the substrate in the plasma. Further details relating to these so-called "plasma immersion implantation" methods are described, for example, in U.S. Pat. No. 5,911,832 (Denholm et al.).

This allows a very dense oxygen plasma to be produced, which provides a sufficiently large number of low-energy oxygen ions for the heat treatment of the SBT layer. At the same time, the potential of the plasma 17' may be adjusted over a wide range, so that a sufficiently strong electric field can be produced for alignment of the domains in the SBT layer. Heating lamps 23 are also provided in order to heat the substrate 1, and are arranged above the mount 20. The process parameters may in this case be varied over wide ranges: cathode temperature 50–700° C., RF power 30–500 watts, gas flow 100–700 sccm, plasma density $3 \times 10^{11}$ ions/cm$^3$, ion flux>$10^{16}$ ions/(cm$^2$ min), pressure 0.1–3 torr.

After the heat treatment process, the upper electrode of the storage capacitors is once again deposited over the entire area. Once the upper electrode has been applied, a heat treatment process is carried out, in order to cure the boundary layer between the ferroelectric layer 10 and the upper electrode 13. The three layers, the noble metal layer 13, the ferroelectric layer 10 and the noble metal layer 9, are then structured by mearis of anisotropic etching methods, once again resulting in the structure which is shown in FIG. 8.

The methods according to the invention have the advantage that the electric field which is applied for crystallization allows ferroelectric layers to be produced whose domains are aligned in a preferred manner such that their polarization vectors are at right angles to the electrodes of the storage capacitor in a memory cell. This results in the entire polarization vector of the domains running essentially parallel to the field of the storage capacitor during operation of the memory arrangement, and in a correspondingly high remanent polarization being produced. The signal which can be read from the storage capacitors is correspondingly high.

In the described embodiments of the present invention, the lower electrode 9, the ferroelectric layer 10 and the upper electrode 13 were structured essentially simultaneously by means of one or more anisotropic etching methods. However, as an alternative to this, the lower electrode 9 may be structured even before the application of the ferroelectric material, by means of an etching method and/or a CMP method. It is also possible for the ferroelectric layer 10 and the lower electrode 9 to be structured before the upper electrode 13 is produced.

We claim:

1. A method for producing a ferroelectric layer, said method comprising the steps of:
  a) providing a substrate;
  b) applying a layer of a material for the subsequent ferroelectric layer over a surface of the substrate; and
  c) changing the layer of material to a ferroelectric phase by providing an electric field aligned along a predetermined direction while heat treating the material, said step of providing an electric field including using the substrate as an electrode and producing a plasma as a second electrode above the material.

2. A method according to claim 1, wherein the ferroelectric layer is a strontium bismuth tantalate layer (SBT, $SrBi_2Ta_2O_9$) and the heat treating is carried out at a temperature of between 500° C. and 820° C.

3. A method according to claim 2, wherein the temperature range is between 700° C. and 800° C.

4. A method according to claim 2, wherein the temperature range is between 700° C. and 750° C.

5. A method, according to claim 1, wherein the ferroelectric layer is a lead zirconate titanate layer (PZT, $Pb(Zr, Ti)O_3$), and the heat treating is carried out at a temperature range of between 400° C. and 600° C.

6. A method according to claim 1, wherein the field strength of the electric field is between 1 and 100 kV/cm.

7. A method according to claim 1, which includes applying a noble metal electrode on the substrate and then applying the material on the noble metal electrode.

8. A method according to claim 7, which includes arranging a conductive plate above the layer of material and using the plate to provide the electric field.

9. A method according to claim 1, which includes applying voltage pulses to immerse the substrate in the plasma.

10. A method according to claim 1, wherein the heat treating is carried out in an $N_2/O_2$ atmosphere.

11. A method according to claim 1, wherein the heat treating is carried out in a $He/O_2$ atmosphere.

12. A method according to claim 1, wherein the heat treating is carried out in an atmosphere with a pressure of 0.05 to 10 Pa.

13. A method according to claim 1, wherein the applying of the material is by a chemical vapor deposition.

14. A method according to claim 1, wherein the applying of the material applies the material as an amorphous film.

15. A method according to claim 1, wherein the heat treating is for a period of 5 to 90 minutes.

16. A method according to claim 1, wherein the step of providing a substrate provides a substrate with a noble metal electrode, said step of applying the material applies the material on the noble metal electrode and, after changing the material to a ferroelectric layer, applying a second noble metal electrode to the ferroelectric layer to form a ferroelectric storage capacitor.

17. A method according to claim 16, wherein the substrate has a number of memory cells with each cell having at least one transistor and at least one ferroelectric storage capacitor so as to form a ferroelectric memory arrangement.

* * * * *